(12) United States Patent
Pan

(10) Patent No.: US 7,606,321 B2
(45) Date of Patent: Oct. 20, 2009

(54) SYSTEM AND METHOD FOR SIMPLIFYING ANALOG PROCESSING IN A TRANSMITTER INCORPORATING A RANDOMIZATION CIRCUIT

(75) Inventor: Meng-An Pan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 422 days.

(21) Appl. No.: 10/877,975

(22) Filed: Jun. 29, 2004

(65) Prior Publication Data

US 2005/0164657 A1 Jul. 28, 2005

Related U.S. Application Data

(63) Continuation-in-part of application No. 10/761,626, filed on Jan. 22, 2004.

(51) Int. Cl.
*H04L 27/00* (2006.01)
(52) U.S. Cl. ............... 375/295; 375/272; 375/273; 375/274; 375/275; 375/279; 375/280; 375/281; 375/282; 375/283; 375/284; 375/285; 375/296; 375/303; 375/304; 375/305; 375/306; 375/307; 375/308; 375/309
(58) Field of Classification Search ............... 375/298, 375/135, 141, 272–275, 279–285, 295–296, 375/303–309; 455/91
See application file for complete search history.

(56) References Cited

U.S. PATENT DOCUMENTS

| 5,166,959 | A | * | 11/1992 | Chu et al. | 377/20 |
| 5,245,344 | A | | 9/1993 | Sooch | |
| 5,309,482 | A | * | 5/1994 | Wright et al. | 375/350 |
| 5,592,165 | A | * | 1/1997 | Jackson et al. | 341/143 |
| 5,701,106 | A | * | 12/1997 | Pikkarainen et al. | 332/100 |
| 5,821,892 | A | * | 10/1998 | Smith | 341/150 |
| 5,977,899 | A | * | 11/1999 | Adams | 341/145 |
| 6,075,473 | A | * | 6/2000 | Masuda | 341/118 |
| 6,121,910 | A | * | 9/2000 | Khoury et al. | 341/143 |
| 6,445,318 | B1 | * | 9/2002 | Ruha et al. | 341/131 |
| 7,227,910 | B2 | * | 6/2007 | Lipka | 375/302 |
| 2002/0154678 | A1 | * | 10/2002 | Doetsch et al. | 375/130 |
| 2004/0223553 | A1 | * | 11/2004 | Kumar | 375/259 |
| 2004/0263365 | A1 | * | 12/2004 | Robinson et al. | 341/77 |

FOREIGN PATENT DOCUMENTS

WO    WO 96/15585    5/1996

OTHER PUBLICATIONS

McCabe David, James "RF Transmitter" WO 96/15585 publication date May 23, 1996.*

* cited by examiner

*Primary Examiner*—Mohammad H Ghayour
*Assistant Examiner*—Sophia Vlahos

(57) ABSTRACT

The system and method enable simpler analog processing in a transmitter by reducing the number of bits in a digital signal through delta sigma modulation. Selection of current sources in a digital to analog converter of the transmitter is done using a randomization circuit.

13 Claims, 6 Drawing Sheets

US 7,606,321 B2

SYSTEM AND METHOD FOR SIMPLIFYING ANALOG PROCESSING IN A TRANSMITTER INCORPORATING A RANDOMIZATION CIRCUIT

CROSS REFERENCE TO RELATED APPLICATIONS

The present application incorporates by reference and is a continuation-in-part of U.S. patent application Ser. No. 10/761,626, filed Jan. 22, 2004, entitled "System and Method for Simplifying Analog Processing In a Transmitter" by inventors Meng-An Pan and Bojko Marholev.

BACKGROUND

1. Technical Field

This invention relates generally to wireless communication systems, and more particularly, but not exclusively, to simplifying analog processing in a wireless communication system.

2. Description of the Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channel pair (e.g., one of the plurality of radio frequency (RF) carriers of the wireless communication system) and communicate over that channel or channel pair. For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, removes the RF carrier frequency from the RF signals directly or via one or more intermediate frequency stages, and demodulates the signals in accordance with a particular wireless communication standard to recapture the transmitted data. The transmitter converts data into RF signals by modulating the data to RF carrier in accordance with the particular wireless communication standard and directly or in one or more intermediate frequency stages to produce the RF signals.

When converting digital data to analog for transmission as RF signals, it is beneficial to reduce the number of bits in the digital data in order to simplify a Digital to Analog Converter (DAC) and lessen power requirements. However, decreasing the number of bits in the digital data may also decrease the signal to noise ratio, thereby decreasing the clarity of the data carried in the RF signals.

Accordingly, a new system and method are needed that use less hardware and power than conventional transmitters without substantially reducing clarity of the data carried in the RF signals.

SUMMARY

Embodiments of the invention form a system and method that enable simpler analog processing through the use of delta sigma modulation. Accordingly, less hardware and power are required, thereby reducing cost and size of a transmitter.

In an embodiment of the invention, an RF transmitter comprises a delta sigma modulator, a digital to analog converter (DAC), a mixer, and an antenna. The delta sigma modulator performs delta sigma modulation on a digital quadrature signal. The DAC, which is communicatively coupled to the delta sigma modulator, converts the modulated signal to an analog signal using randomly selected current sources. The mixer, which is communicatively coupled to the DAC, converts the analog signal to an RF signal. The antenna, which is communicatively coupled to the mixer, transmits the RF signal.

In an embodiment of the invention, the method comprises: performing delta sigma modulation on a digital quadrature signal; converting the modulated signal to an analog signal using randomly selected current sources of a Digital to Analog Converter; converting the analog signal to an RF signal; and transmitting the RF signal.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

The following description is provided to enable any person having ordinary skill in the art to make and use the invention, and is provided in the context of a particular application and its requirements. Various modifications to the embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
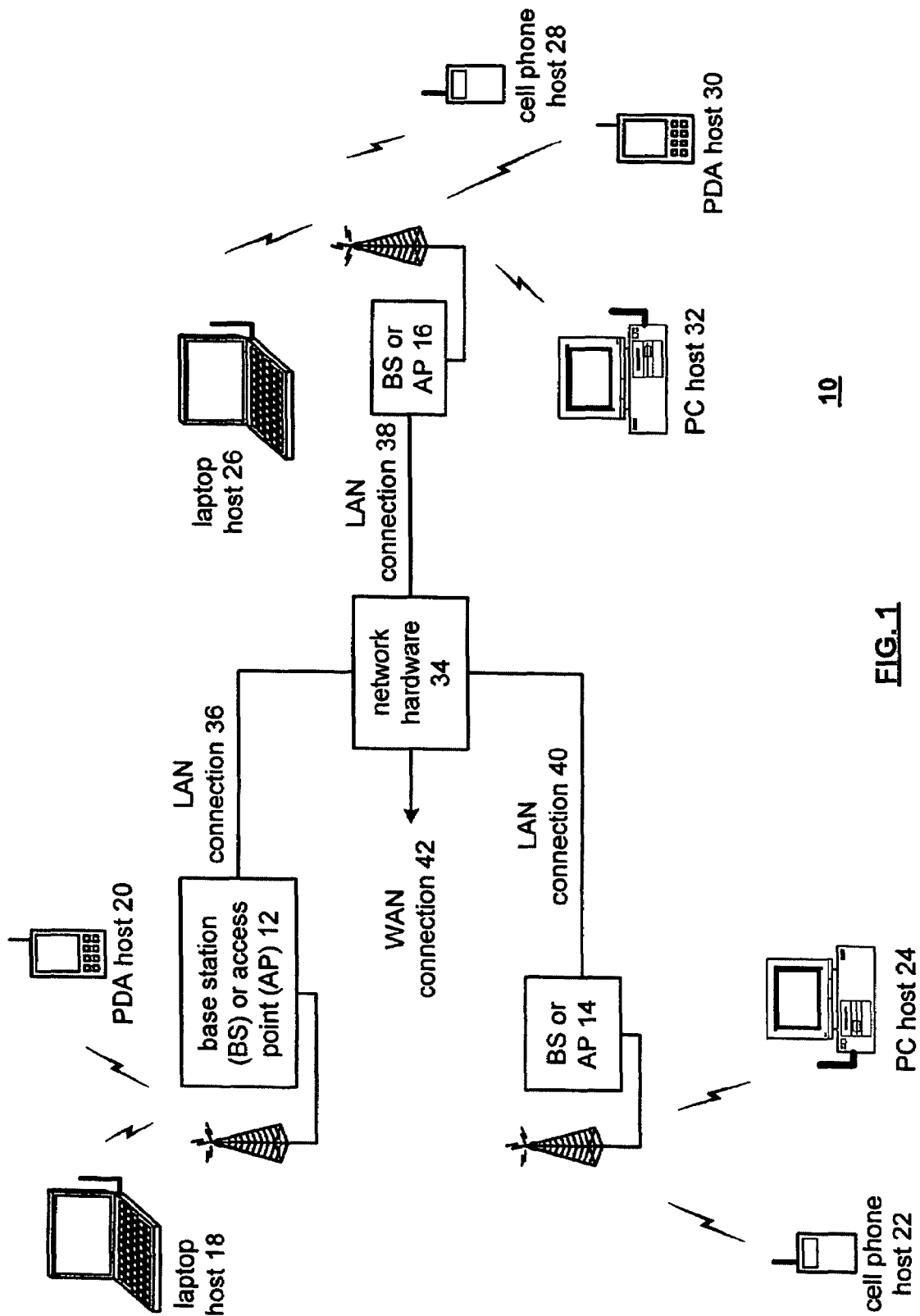
FIG. 1 is a block diagram illustrating a network system according to an embodiment of the present invention.

FIG. 1 is a block diagram illustrating a network system 10 according to an embodiment of the present invention. The system 10 includes a plurality of base stations and/or access points 12, 14 and 16, a plurality of wireless communication devices 18, 20, 22, 24, 26, 28, 30 and 32 and a network hardware component 34. The wireless communication devices 18, 20, 22, 24, 26, 28, 30 and 32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12 are operably coupled to the network hardware 34 via local area network connections 36, 38 and 40. The network hardware 34, which may be a router, switch, bridge, modem, system controller, etc. provides a wide area network connection 42 for the communication system 10. Each of the base stations or access points 12, 14 and 16 has an associated antenna or antenna array to communicate with the wireless communication devices in its area. Typically, the wireless communication devices register with a particular base station or access point 12 and 14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a transmitter capable of simplified analog processing and therefore has characteristics of reduced power requirements, reduced costs, and reduced size.

Figure 2:
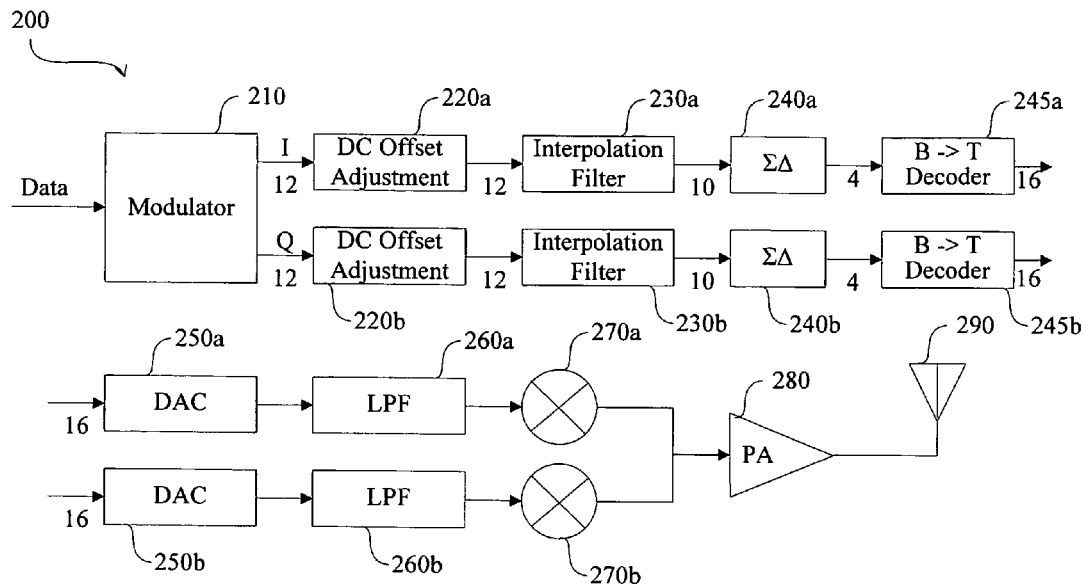
FIG. 2 is a block diagram illustrating a transmitter section according to an embodiment of the present invention.

FIG. 2 is a block diagram illustrating a transmitter section 200 according to an embodiment of the present invention. Each wireless device of the network system 10 can include a transmitter portion 200 for transmitting data to other wireless network nodes. The transmitter section 200 includes a modulator 210 communicatively coupled to DC Offset Adjustment Engines 220a and 220b, which are communicatively coupled to Interpolation Filters 230a and 230b respectively. The Interpolation Filters 230a and 230b and communicatively coupled to delta sigma modulators 240a and 240b respectively (also referred to as sigma delta modulators). The delta sigma modulators 240a and 240b are communicatively coupled to binary to thermometer decoders 245a and 245b respectively. The decoders 245a and 245b are communicatively coupled to the DACs 250a and 250b respectively, which are communicatively coupled to low pass filters (LPFs) 260a and 260b. The LPFs 260a and 260b are communicatively coupled to mixers 270a and 270b respectively, which are each communicatively coupled to a power amplifier 280, which is communicatively coupled to an antenna 290.

The modulator 210 receives digital data from a processing component of a wireless device and performs quadrature amplitude modulation on the data. The modulation can include, for example, Gaussian Frequency Shift Keying (GFSK), 4-Phase Shift Keying (PSK), and/or 8-PSK. The modulator 210 provides quadrature outputs. In an embodiment of the invention, the sampling frequency is 12 MHz and output is 12 bits.

For FSK modulation, the I output can be represented as $I=\cos(2\pi fct+2\pi f_d \int vdt)$ and the Q output can be represented as $I=\sin(2\pi fct+2\pi f_d \int vdt)$. For PSK modulation, the I output can be represented as $I=\text{Re}(R(t)e^{j2\Pi F_j ft})$ and the Q output can be represented as $Q=\text{IM}(R(t)e^{j2\Pi F_j ft})$.

The DC offset adjustment engines 220a and 220b adjust the DC offset at the digital domain of the I and Q outputs from the modulator 210. The DC adjustment word length is 11 bits.

The interpolation filters 230a and 230b up sample the output from 12 MHz to 96 MHz. Higher OSR will make the following delta sigma modulation easier. For IF frequency $\leq 1$ MHz, the interpolation filters 230a and 230b filter out the 12 MHz image by more than 80 dBc. For IF of 2 MHz, the interpolation filters 230a and 230b filter out the 12 MHz by more than 60 dBc. Output of the interpolation filters 230a and 230b are 10 bits.

The delta sigma modulators 240a and 240b are second order delta sigma modulators that output 4 bits from a 10 bit input. The delta sigma modulators 240a and 240b also push quantization noise outside the LPF 260a and 260b bandwidth as will be discussed in further detail in conjunction with FIG. 3A and FIG. 3B below. The sampling frequency of the delta sigma modulators 240a and 240b are each 96 MHz. Input ranges from −2 to 1.75. Depending on control bit settings, incoming input can range from −1 to +1 or from −1.25 to +1.25. The extra range is reserved for signal excursions when modulation is present. With an input range of −1.25 to +1.25 and no modulation, output amplitude will be 5. The binary to thermometer decoders 245a and 245b convert the 4 bit output from delta sigma modulators 240a and 240b to thermometer coding (16 bits) according to Table I. In an embodiment of the invention, the DACs 250a and 250b incorporate the decoders 245a and 245b therein.

TABLE I

| ΔΣ Output | Binary Number | Mag | b15 | b14 | b13 | b12 | b11 | b10 | b9 | b8 | b7 | b6 | b5 | b4 | b3 | b2 | b1 | b0 |
|---|---|---|---|---|---|---|---|---|---|---|---|---|---|---|---|---|---|---|
| 7 | 0111 | 15 | 0 | 1 | 1 | 1 | 1 | 1 | 1 | 1 | 1 | 1 | 1 | 1 | 1 | 1 | 1 | 1 |
| 6 | 0110 | 14 | 0 | 0 | 1 | 1 | 1 | 1 | 1 | 1 | 1 | 1 | 1 | 1 | 1 | 1 | 1 | 1 |
| 5 | 0101 | 13 | 0 | 0 | 0 | 1 | 1 | 1 | 1 | 1 | 1 | 1 | 1 | 1 | 1 | 1 | 1 | 1 |
| 4 | 0100 | 12 | 0 | 0 | 0 | 0 | 1 | 1 | 1 | 1 | 1 | 1 | 1 | 1 | 1 | 1 | 1 | 1 |

TABLE I-continued

| ΔΣ Output | Binary Number | Mag | b15 | b14 | b13 | b12 | b11 | b10 | b9 | b8 | b7 | b6 | b5 | b4 | b3 | b2 | b1 | b0 |
|---|---|---|---|---|---|---|---|---|---|---|---|---|---|---|---|---|---|---|
| 3  | 0011 | 11 | 0 | 0 | 0 | 0 | 0 | 1 | 1 | 1 | 1 | 1 | 1 | 1 | 1 | 1 | 1 | 1 |
| 2  | 0010 | 10 | 0 | 0 | 0 | 0 | 0 | 0 | 1 | 1 | 1 | 1 | 1 | 1 | 1 | 1 | 1 | 1 |
| 1  | 0001 | 9  | 0 | 0 | 0 | 0 | 0 | 0 | 0 | 1 | 1 | 1 | 1 | 1 | 1 | 1 | 1 | 1 |
| 0  | 0000 | 8  | 0 | 0 | 0 | 0 | 0 | 0 | 0 | 0 | 1 | 1 | 1 | 1 | 1 | 1 | 1 | 1 |
| -1 | 1111 | 7  | 0 | 0 | 0 | 0 | 0 | 0 | 0 | 0 | 0 | 1 | 1 | 1 | 1 | 1 | 1 | 1 |
| -2 | 1110 | 6  | 0 | 0 | 0 | 0 | 0 | 0 | 0 | 0 | 0 | 0 | 1 | 1 | 1 | 1 | 1 | 1 |
| -3 | 1101 | 5  | 0 | 0 | 0 | 0 | 0 | 0 | 0 | 0 | 0 | 0 | 0 | 1 | 1 | 1 | 1 | 1 |
| -4 | 1100 | 4  | 0 | 0 | 0 | 0 | 0 | 0 | 0 | 0 | 0 | 0 | 0 | 0 | 1 | 1 | 1 | 1 |
| -5 | 1011 | 3  | 0 | 0 | 0 | 0 | 0 | 0 | 0 | 0 | 0 | 0 | 0 | 0 | 0 | 1 | 1 | 1 |
| -6 | 1010 | 2  | 0 | 0 | 0 | 0 | 0 | 0 | 0 | 0 | 0 | 0 | 0 | 0 | 0 | 0 | 1 | 1 |
| -7 | 1001 | 1  | 0 | 0 | 0 | 0 | 0 | 0 | 0 | 0 | 0 | 0 | 0 | 0 | 0 | 0 | 0 | 1 |
| -8 | 1000 | 0  | 0 | 0 | 0 | 0 | 0 | 0 | 0 | 0 | 0 | 0 | 0 | 0 | 0 | 0 | 0 | 0 |

The DACs 250a and 250b, as will be discussed in further detail in conjunction with FIG. 5 below, use thermometer coding to minimize sampling clock (96 MHz) glitches. The DACs 250a and 250b convert the digital signals to analog signals. The LPFs 260a and 260b receive the analog signals and filter out any glitches to generate a continuous signal. The mixers 270a and 270b convert the analog signals to an RF signal (e.g., 2.4 GHz for Bluetooth), which is then amplified by the power amplifier 280 and transmitted by the antenna 290.

Figure 3A:
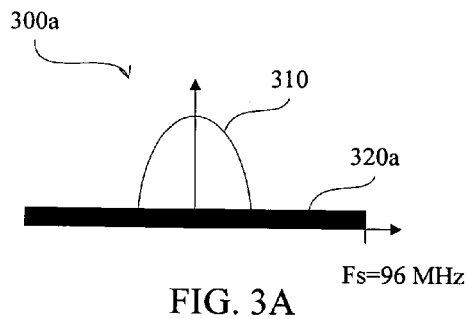
FIG. 3A and FIG. 3B are diagrams illustrating delta sigma modulation effect on quantization noise.
Figure 3B:
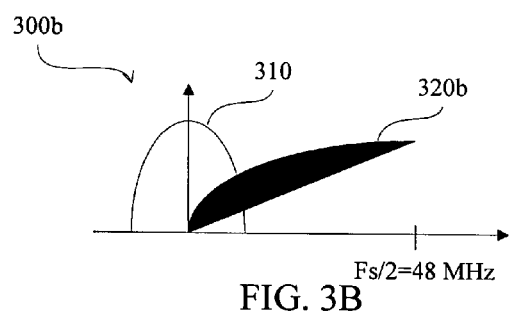

FIG. 3A and FIG. 3B are diagrams illustrating delta sigma modulation effect on quantization noise. The delta sigma modulation performed by the delta sigma modulator minimizes the quantization noise 320a by pushing a substantial portion of the noise 320a outside of the signal 310. As shown in FIG. 3B, the reshaped quantization noise 320b is substantially outside of the signal 310 and outside of the LPFs 260a and 260b bandwidth.

Figure 4:
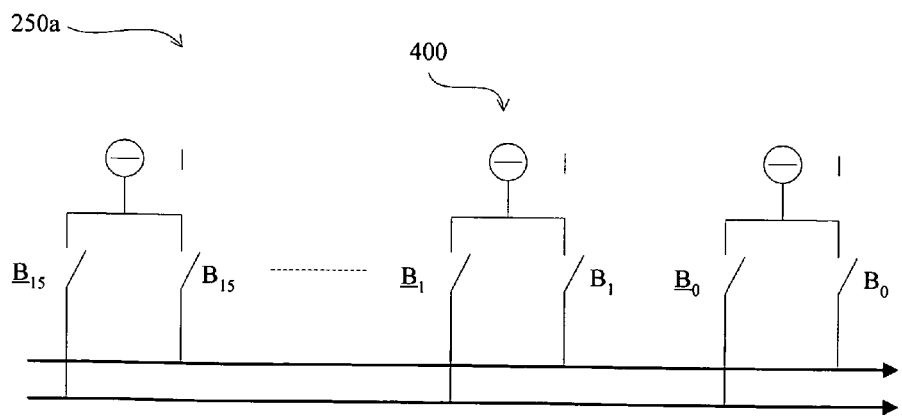
FIG. 4 is a block diagram illustrating a Digital to Analog Converter.

FIG. 4 is a block diagram illustrating the DAC 250a. The DAC 250b can be hardware equivalent to the DAC 250a. The DAC 250a includes 15 unit current sources, such as current source 400. In another embodiment of the invention, a different number of current sources may be used based on the delta sigma output. The DAC 250a uses thermometer coded input from the decoders 245a and 245b. $I_{unit}$ is 16 µA. $I_{dc}$ is equal to 16*8=128 µA. $I_{amp}$ is equal to 5*16=80 µA. In an embodiment of the invention, the DAC 250a can have a W/L of 32 µm/0.5 µm to ensure that current cells have enough matching and to provide the output with room to swing.

Table II below shows output Iout of the DAC 250a based on the delta sigma output and corresponding thermometer coding.

TABLE II

| ΔΣ Out | Equivalent Value | Thermometer Out | Ip | In | Iout = Ip − In |
|---|---|---|---|---|---|
| 0111 | 1.75   | 15 | 15 * I | 1 * I  | 14 * I  |
| .    | .      | .  | .      | .      | .       |
| .    | .      | .  | .      | .      | .       |
| 0001 | 0 + 0.25 | 9 | 9 * I  | 7 * I  | 2 * I   |
| 0000 | 0      | 8  | 8 * I  | 8 * I  | 0 * I   |
| 1111 | −0.25  | 7  | 7 * I  | 9 * I  | −2 * I  |
| .    | .      | .  | .      | .      | .       |
| .    | .      | .  | .      | .      | .       |
| 1000 | −2     | 0  | 0 * I  | 16 * I | −16 * I |

Figure 5:
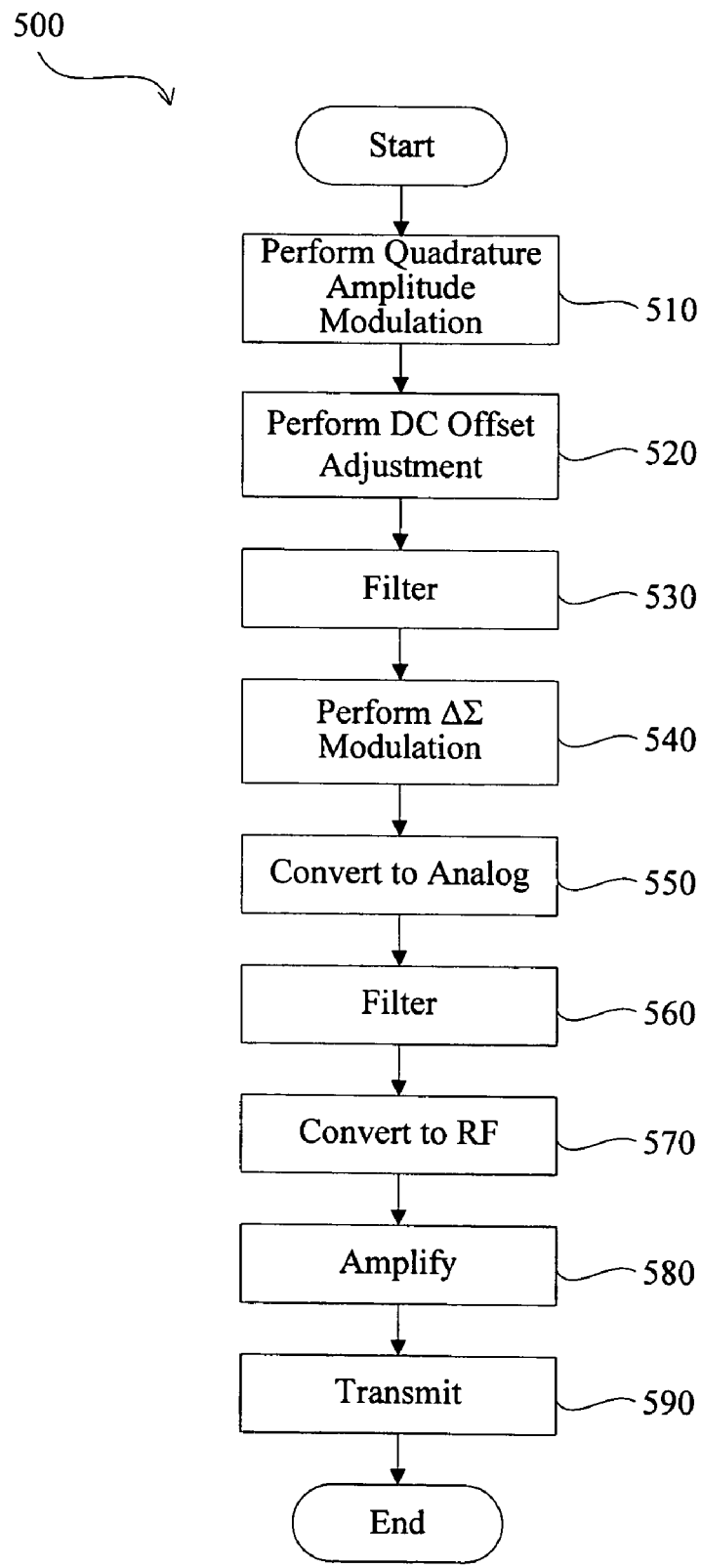
FIG. 5 is a flowchart illustrating a method of simplifying analog processing in a wireless transmitter.

FIG. 5 is a flowchart illustrating a method 500 of simplifying analog processing in a wireless transmitter. In an embodiment of the invention, the transmitter section 200 can perform the method 500. First, quadrature amplitude modulation is performed (510) on received digital data to generate I and Q signals. DC offset adjustment is then performed (520) on the I and Q signals. Interpolation filtering on the I and Q signals is then performed (530) to generate a 10 bit output.

After the interpolation filtering (530), delta sigma modulation is performed (540) to reduce the 10 bit output to 4 bits. The performance (540) of delta sigma modulation pushes quantization noise out of the bandwidth of the LPFs 260a and 260b. The delta sigma modulation (540) can include coding the modulated data with a thermometer code. After performing (540) the delta sigma modulation, the 4 bit signals are converted to analog (550), filtered (560), converted (570) to radiofrequency (RF) signals, amplified (580) and transmitted (590). The method 500 then ends.

Accordingly, embodiments of the invention enable simpler analog processing by reducing the number of bits of digital data without substantially decreasing the signal to noise ratio. Therefore, less hardware and less power are required to perform the analog processing. However, due to variations in each current source of the DAC 250a from manufacturing processes, etc., the DAC 250a may not be purely linear.

Figure 6A:
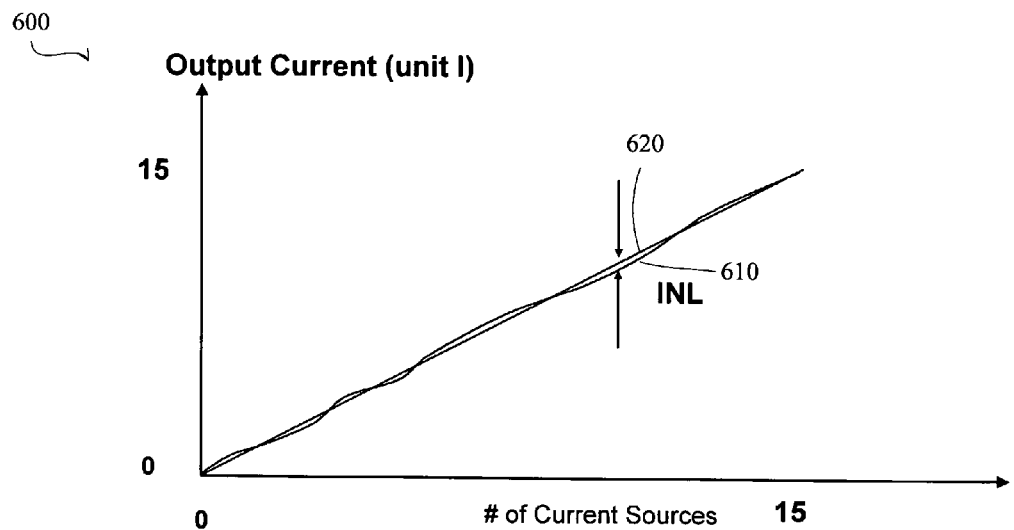
FIG. 6A is a graph illustrating the difference between actual output current and ideal output current from the Digital to Analog Converter.

FIG. 6A is a graph 600 illustrating the difference between actual output current and ideal output current from the Digital to Analog Converter 250a. Due to variations in each current source of the DAC 250a, the actual output current, as illustrated by line 610, varies from the ideal linear output current, as indicated by line 620. In other words, each current source is not perfectly matched. Accordingly, each current source may output a slightly different current, which leads to incorrect modulated data in the RF signal.

Figure 6B:
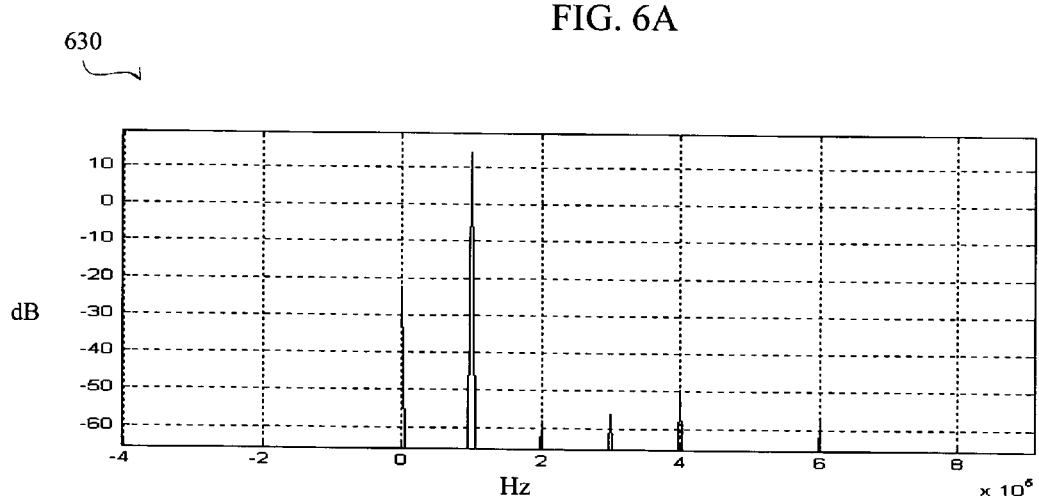
FIG. 6B is a graph illustrating the spectrum of the Digital to Analog Converter without a randomization circuit.

FIG. 6B is a graph illustrating the spectrum of the Digital to Analog Converter 250a without a randomization circuit. The non-linearity can cause undesired spurts in the DAC's spectrum, e.g., undesired harmonics. For example, undesired spurts occur at 0, 200, 300, 400, and 600 KHz.

Figure 7:
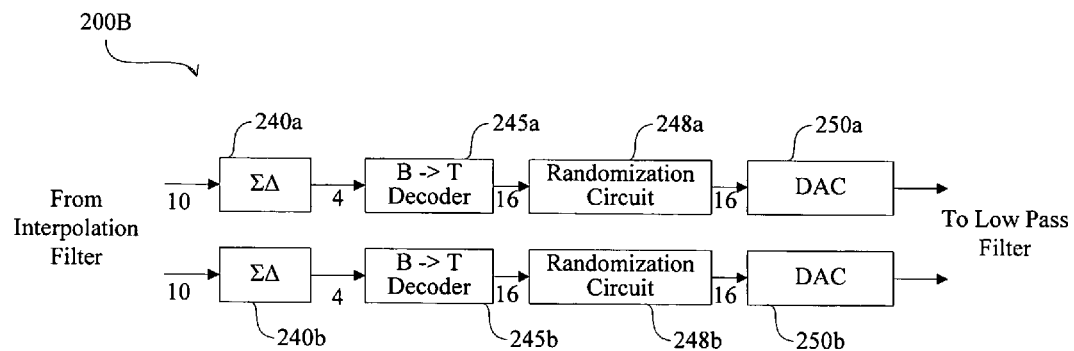
FIG. 7 is a block diagram illustrating a portion of the transmitter section with a randomization circuit according to an embodiment of the invention.

FIG. 7 is a block diagram illustrating a portion of the transmitter section 200B with a randomization circuit 248 according to an embodiment of the invention. The transmitter section 200B includes the same components as the transmitter section 200 except that randomization circuits 248a and 248b are interposed between the decoder 245a and the DAC 250a and the decoder 245b and the DAC 250b, respectively.

In an embodiment of the invention, the randomizer circuits 248a and 248b may be hardware identical. As such, for purposes of brevity, only the randomizer circuit 248a will be discussed in the understanding that the randomizer circuit 248b acts substantially identically to the randomizer circuit 248a.

The randomizer circuit 248a randomly selects current sources in the DAC 250a so that the same current sources are not always consistently selected. The number of current sources selected is based on the thermometer coded output from the decoder 245a, as discussed above. For example, for a thermometer coded output of 1, selection of current source $B_0$ is as likely as $B_{15}$. For a thermometer coded output of 3, current sources B0, B1, and B2 will not always be selected. Instead 3 current sources are selected randomly (e.g., $B_0$, $B_7$, $B_9$). Accordingly, over time, variations in output current are averaged out, thereby bringing current output closer to the ideal output (as indicated by line 620 in FIG. 6).

Random selection is done using a DSP algorithm. In general, the DSP algorithm randomizes the mapping of Table I above.

Figure 8:
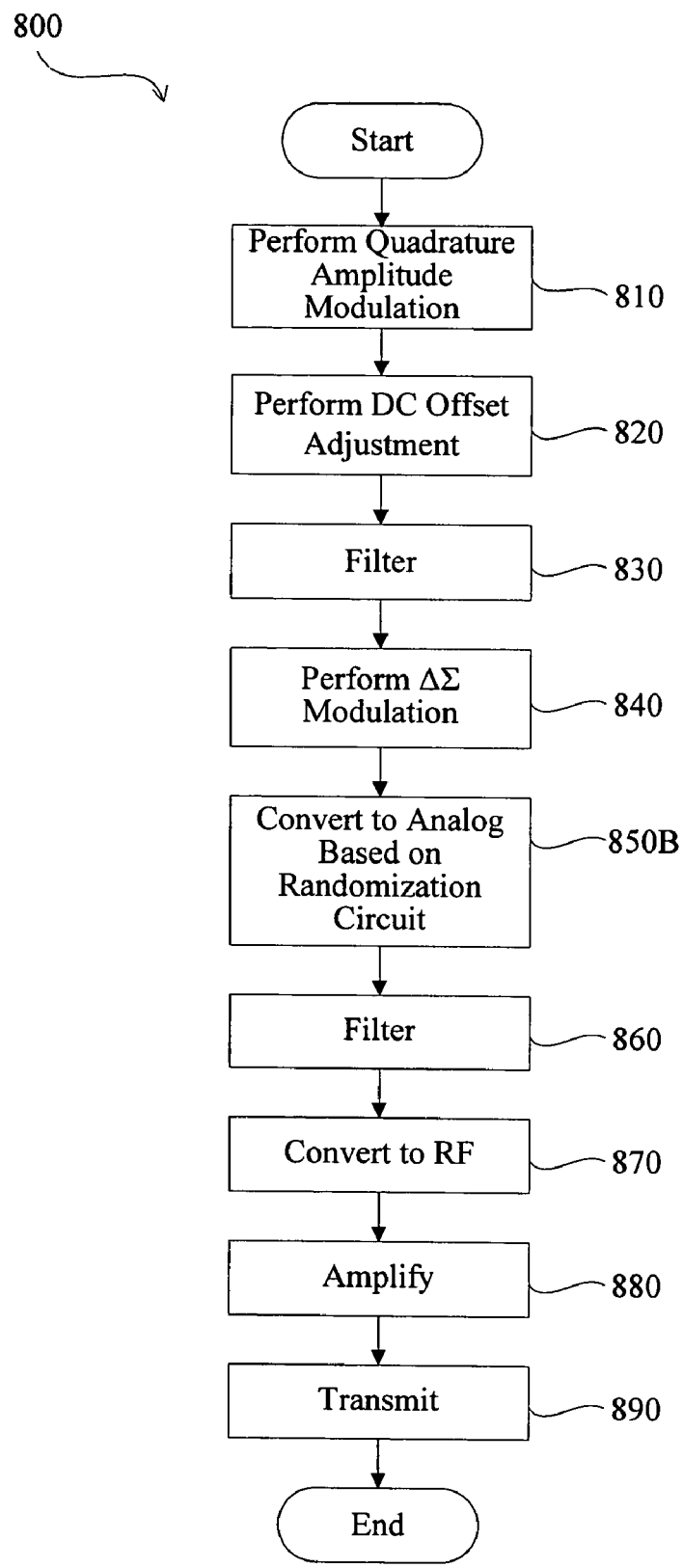
FIG. 8 is a flowchart illustrating a method of simplifying analog processing in a transmitter using a randomization circuit.

FIG. 8 is a flowchart illustrating a method 800 of simplifying analog processing in a transmitter using a randomization circuit. In an embodiment of the invention, the transmitter section 200B can perform the method 800. First, quadrature amplitude modulation is performed (810) on received digital data to generate I and Q signals. DC offset adjustment is then performed (820) on the I and Q signals. Interpolation filtering on the I and Q signals is then performed (830) to generate a 10 bit output.

After the interpolation filtering (830), delta sigma modulation is performed (840) to reduce the 10 bit output to 4 bits. The performance (840) of delta sigma modulation pushes quantization noise out of the bandwidth of the LPFs 260a and 260b. The delta sigma modulation (840) can include coding the modulated data with a thermometer code. After performing (840) the delta sigma modulation, the 4 bit signals are converted to analog wherein a specified number of current sources of the DAC are randomly selected, as discussed above in conjunction with FIG. 7. The analog signal is then filtered (860), converted (870) to radiofrequency (RF) signals, amplified (880) and transmitted (890). The method 800 then ends.

Figure 9:
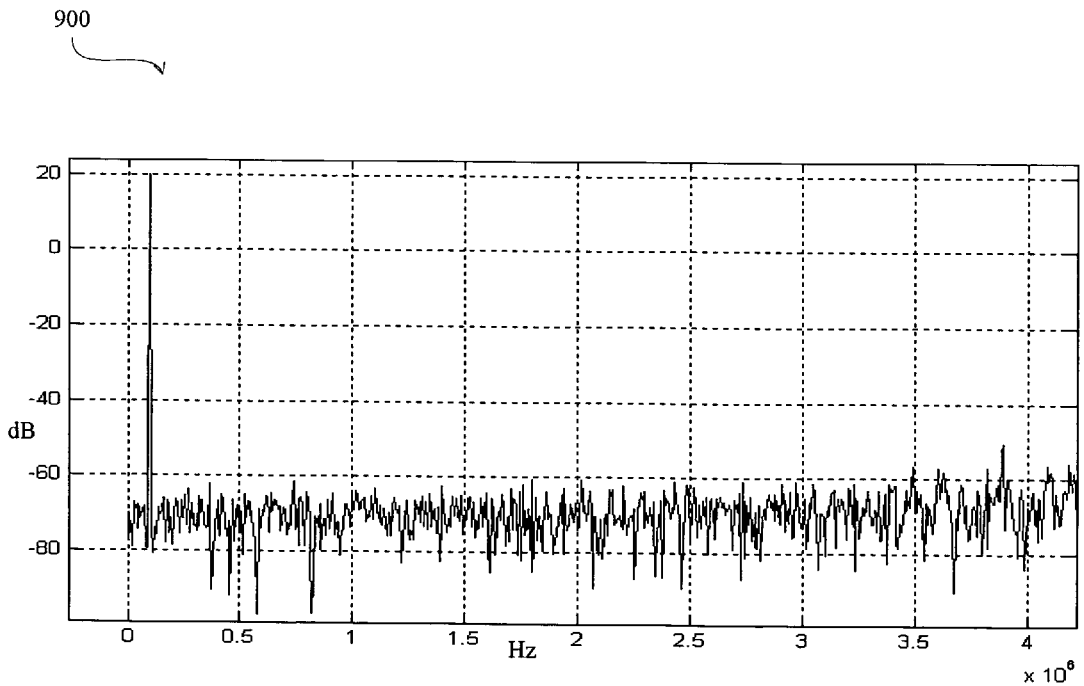
FIG. 9 is a graph illustrating the spectrum of the Digital to Analog Converter with a randomization circuit.

FIG. 9 is a graph 900 illustrating the spectrum of the Digital to Analog Converter 200B with a randomization circuit 248a. Use of the randomization circuit 248a eliminates undesired harmonics in the DAC 200B as shown in the graph 900. For example, spurts at 0, 200, 300, and 400 KHz are absent.

The foregoing description of the illustrated embodiments of the present invention is by way of example only, and other variations and modifications of the above-described embodiments and methods are possible in light of the foregoing teaching. Components of this invention may be implemented using a programmed general purpose digital computer, using application specific integrated circuits, or using a network of interconnected conventional components and circuits. Connections may be wired, wireless, modem, etc. The embodiments described herein are not intended to be exhaustive or limiting. The present invention is limited only by the following claims.

What is claimed is:

1. A method, comprising:
    performing interpolation filtering on a digital quadrature signal, wherein the interpolation filtering reduces the digital quadrature signal from 12 bits to 10 bits;
    performing delta sigma modulation on the interpolated digital quadrature signal;
    coding the modulated signal with a thermometer code;
    converting the coded signal to an analog signal using randomly selected current sources of a Digital to Analog Converter;
    converting the analog signal to an RF signal; and
    transmitting the RF signal.

2. The method of claim 1, wherein the modulation reduces the number of bits of the digital quadrature signal.

3. The method of claim 2, wherein the reduction is from 10 bits to 4 bits.

4. The method of claim 1, further comprising amplifying the RF signal before the transmitting.

5. The method of claim 1, wherein the delta sigma modulation includes $2^{nd}$ order delta sigma modulation.

6. The method of claim 1, wherein the digital quadrature signal is formed using one of GFSK, 4-PSK, and 8-PSK modulations.

7. A system, comprising:
    means for performing interpolation filtering on a digital quadrature signal, wherein the interpolation filtering reduces the digital quadrature signal from 12 bits to 10 bits;
    means for performing delta sigma modulation on the interpolated digital quadrature signal;
    means for coding the modulated signal with a thermometer code;
    means for converting the coded signal to an analog signal using randomly selected current sources of a Digital to Analog Converter;
    means for converting the analog signal to an RF signal; and
    means for transmitting the RF signal.

8. An RF transmitter, comprising:
    an interpolation filter configured to perform interpolation filtering on a digital quadrature signal, wherein the interpolation filtering reduces the digital quadrature signal from 12 bits to 10 bits;
    a delta sigma modulator configured to perform delta sigma modulation on the interpolated digital quadrature signal and configured to code the modulated signal with a thermometer code;
    a DAC, communicatively coupled to the delta sigma modulator, configured to convert the coded signal to an analog signal using randomly selected current sources;
    a mixer, communicatively coupled to the DAC, configured to convert the analog signal to an RF signal; and
    an antenna, communicatively coupled to the mixer, configured to transmit the RF signal.

9. The transmitter of claim 8, wherein the modulation reduces the number of bits of the digital quadrature signal.

10. The transmitter of claim 9, wherein the reduction is from 10 bits to 4 bits.

11. The transmitter of claim 8, further comprising a power amplifier, communicatively coupled to the antenna and the mixer, capable of amplifying the RF signal before the antenna transmits the RF signal.

12. The transmitter of claim 8, wherein the delta sigma modulator includes a 2nd order delta sigma modulator.

13. The transmitter of claim 8, wherein the digital quadrature signal is formed using one of GFSK, 4-PSK, and 8-PSK modulations.

* * * * *

UNITED STATES PATENT AND TRADEMARK OFFICE
CERTIFICATE OF CORRECTION

| | |
|---|---|
| PATENT NO. | : 7,606,321 B2 |
| APPLICATION NO. | : 10/877975 |
| DATED | : October 20, 2009 |
| INVENTOR(S) | : Meng-An Pan |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 630 days.

Signed and Sealed this

Fourteenth Day of December, 2010

David J. Kappos
*Director of the United States Patent and Trademark Office*